United States Patent [19]

Neumann et al.

[11] 4,008,405
[45] Feb. 15, 1977

[54] MOTION DETECTION CIRCUIT FOR ELECTRONIC WEIGHING SYSTEM

[75] Inventors: Leopold Neumann, Lexington; Bernard M. Gordon, Magnolia, both of Mass.

[73] Assignee: Analogic Corporation, Wakefield, Mass.

[22] Filed: June 5, 1975

[21] Appl. No.: 584,052

[52] U.S. Cl. .......................... 307/231; 307/235 B; 307/235 J; 307/235 N; 328/114; 328/132
[51] Int. Cl.[2] ................... H03K 5/20; H03K 5/153
[58] Field of Search ........ 307/235 B, 235 N, 235 J, 307/231, 232; 328/114, 116, 117, 132

[56] References Cited
UNITED STATES PATENTS

| | | | |
|---|---|---|---|
| 3,711,779 | 1/1973 | Allington | 328/114 |
| 3,715,738 | 2/1973 | Kleist et al. | 328/114 X |

*Primary Examiner*—John Zazworsky
*Attorney, Agent, or Firm*—Weingarten, Maxham & Schurgin

[57] ABSTRACT

For use in an electronic digitizer such as employed in an electronic weighing system, a circuit for detecting motion and providing a digital output signal. The circuitry includes a dual slope analog-to-digital converter having means for retaining a representation of the integrated analog level of a present and previous conversion cycle, the levels being representative of sampled data. The stored amplitudes are compared to provide an analog difference signal, and an output signal representative of measured weight is provided only when the difference signal is less than a predetermined reference threshold.

6 Claims, 4 Drawing Figures

MOTION DETECTION CIRCUIT FOR ELECTRONIC WEIGHING SYSTEM

FIELD OF THE INVENTION

This invention relates to electronic motion sensing apparatus especially adapted for use in an electronic digitizer such as in an electronic weighing system.

BACKGROUND OF THE INVENTION

Electronic weighing systems are generally known and include a weighing platform or container adapted to support a mass the weight of which is to be measured, and one or more load cells coupled to the weighing platform and operative to provide an analog signal representative of sensed weight. The analog output signal is converted to digital form by an analog-to-digital converter and the digital signal subsequently processed to provide an output indication of weight which may be employed for purposes of display, automatic control or the like. Weight is determined by measuring the force exerted upon the weighing platform by the mass being measured, and if a measurement is taken before the platform has settled, an inaccurate weight measurement can result.

Various techniques have been proposed to detect weighing platform motion in order to inhibit erroneous output data. In a typical motion sensing circuit of the prior art, digital representations of weight at successive time intervals are stored in data registers and the stored digital data compared to ascertain the magnitude difference therebetween. Other techniques proposed are based on an analog rate measurement achieved by differentiation of the analog weight signal.

SUMMARY OF THE INVENTION

According to the invention, motion sensing circuitry is provided for use in an electronic digitizer such as found in an electronic weighing system. The circuit includes a dual slope analog-to-digital converter having an integrator, first storage means operative at the end of a charging interval to store an analog representation of the integrated amplitude of an input signal and second storage means operative to store an analog representation of the integrated amplitude of the input signal of a previous sampling cycle. The stored analog representations are processed to provide an analog difference signal for accurate comparison with a predetermined stable reference threshold. In the event that the difference signal is greater than the threshold, logic circuitry provides an output indication which is utilized to prevent application of an output weight signal to display or other utilization apparatus. The output weight signal is not inhibited if the difference signal is less than the threshold.

DESCRIPTION OF THE DRAWINGS

The invention will be more fully understood from the following detailed description taken in conjunction with the accompanying drawings wherein.

DETAILED DESCRIPTION OF THE INVENTION

The present invention is described with reference to its use in a digital electronic weighing system for sensing platform motion. It will be appreciated that the invention is not limited to detection of platform motion alone. Rather, the invention is equally applicable for use in comparing first and second analog measurements and is thus useful in monitoring rate of change levels in a variety of applications.

Figure 1:
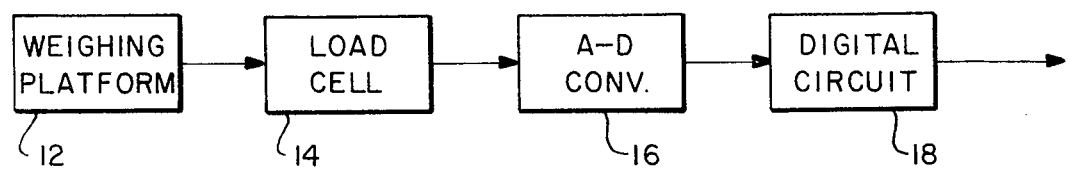
FIG. 1 is a block diagram of a typical electronic weighing system in which the invention is useful.

A typical digital electronic weighing system is shown in FIG. 1 and includes a weighing platform 12 disposed to support a load the weight of which is to be measured. A load cell 14, which may include a strain gauge transducer, is coupled to the platform for sensing the force exerted on the weighing platform and to provide an analog electrical signal representative of the applied force. An analog-to-digital converter 16 of the dual slope type converts the analog signal to a digital form for subsequent processing by digital processing circuitry 18 to provide an output indication of weight. In accordance with the invention, motion sensing circuitry is embodied within the analog-to-digital converter 16 to provide detection of motion of the weighing platform 12.

Figure 2:
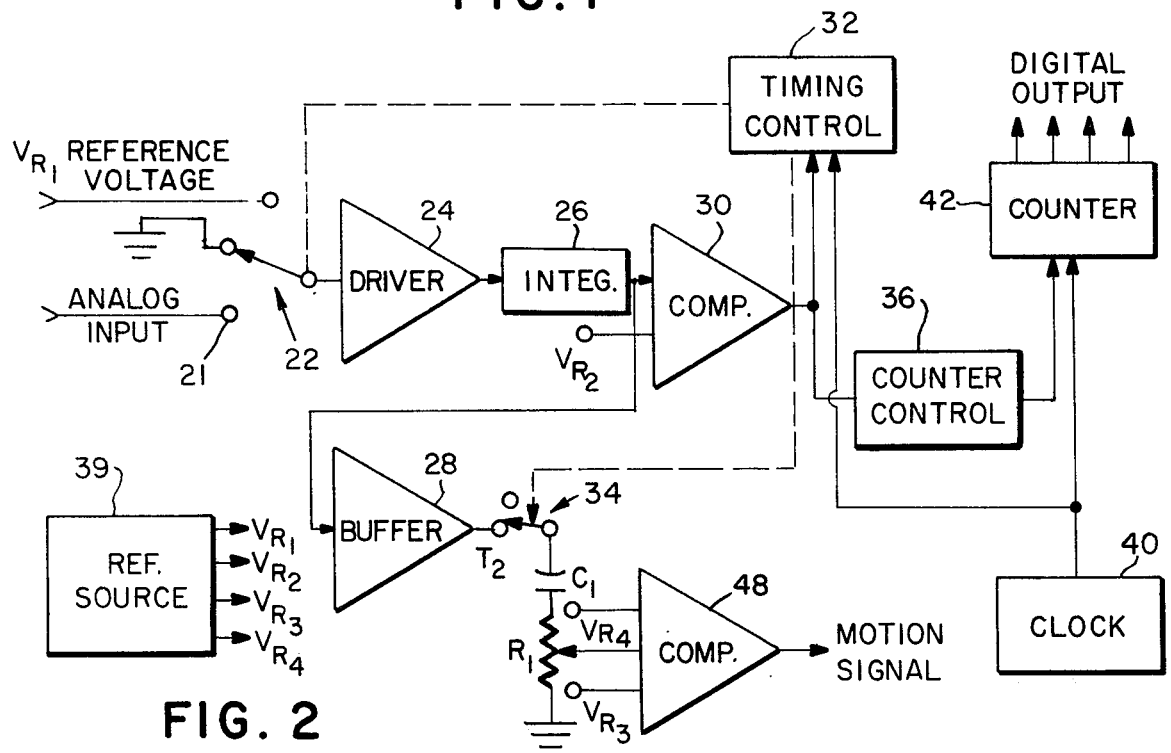
FIG. 2 is a block diagram of a motion detector according to the invention.

Referring to FIG. 2, there is shown in block diagram form a circuit embodying the invention. A timing switch 22, whose control and function will be explained hereinafter, is operative to connect the input signals to a buffer amplifier 24 according to a timed and controlled sequence. The output of the buffer amplifier 24 is coupled to an integrator 26, which is operative to provide signal averaging of the analog input signals. The output of integrator 26 is connected to a buffer 28 and also to a comparator 30. The output of the comparator 30 is provided to timing control 32 which operates switch 22 and switch 34 at the output of buffer 28. The output of comparator 30 is also provided to counter control 36 in order to enable and disable a clock 40 coupled to counter 42 and which may also reset counter 42. The output of clock 40 is also provided to timing control 32 for synchronization. The switch 34 connects buffer amplifier 28 to a storage capacitor $C_1$ and a variable resistor $R_1$. The output of the RC network comprising capacitor $C_1$ and resistor $R_1$ is coupled to a bipolar comparator 48, the output signal of which is indicative of the presence or absence of motion in excess of the predetermined reference level.

The switches 22 and 34 are normally of well-known electronic form but they may be of electromechanical or other form, controllable to be operative in the intended timed manner. Reference voltages $V_{R1}$, $V_{R2}$, $V_{R3}$ and $V_{R4}$ are provided in conventional manner by a suitable source 39.

Figure 3:
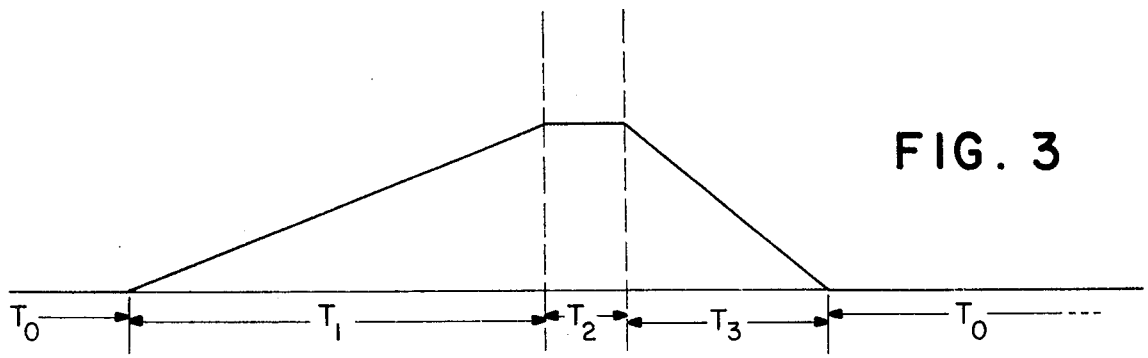
FIG. 3 is a plot useful in explaining operation of the invention.

The operation of the circuitry of FIG. 2 will be more readily understood by reference to the plot of FIG. 3 which represents the output of integrator 26 with respect to time. The plot is divided into four time segments, $T_0$ through $T_3$, each representing a different portion of a timing cycle; namely $T_0$, during which period the circuitry is idle; integration period $T_1$, a period of predetermined length during which switch 22 is connected to analog input 21, permitting integrator 26 to integrate the measured signal; sampling period $T_2$, a period of predetermined length, during which the input through switch 22 is idle and the output of integrator 26 is sampled through buffer amplifier 28 and switch 34 to charge capacitor $C_1$; and measuring period $T_3$, a period of computed length during which the value stored in integrator 26 is discharged at a predetermined rate. The length of $T_3$, as recorded by the counter 42, determines the digital value of the input signal.

Reference voltage $V_{R1}$, of known value and polarity, is provided to the analog input of the circuitry through switch 22 during measuring period $T_3$. Reference $V_{R1}$ is operative to provide a constant discharge rate during measuring period $T_3$. Reference voltage $V_{R2}$ represents the comparison voltage provided to comparator 30 controlling the termination of measuring period $T_3$. Reference voltages $V_{R3}$ and $V_{R4}$ are operative to provide the external reference thresholds indicative of excessive motion, and it may be embodied within comparison means 48 as hereinafter explained.

According to the operation of the invention, during sampling period $T_2$, following the integration period $T_1$ in the dual slope conversion cycle, the voltage at the output of integrator 26 is sampled and the value is transferred via switch 34 to storage capacitor $C_1$. From a prior sampling period there is stored on capacitor $C_1$ a charge representing a prior voltage reading at the output of integrator 26. If there exists a voltage difference between the stored value and the sampled value, a current is generated through resistor $R_1$, developing a difference voltage into comparator 48. The difference voltage is compared therein with the predetermined reference voltages provided to comparator 48. If the analog difference is not within the permissible limit, a motion signal, represented by digital signal of predetermined logic level, prevents transfer of the new data to the output means and/or to give a warning or the like. The conversion sequence need not be interrupted to provide the motion signal.

Figure 4:
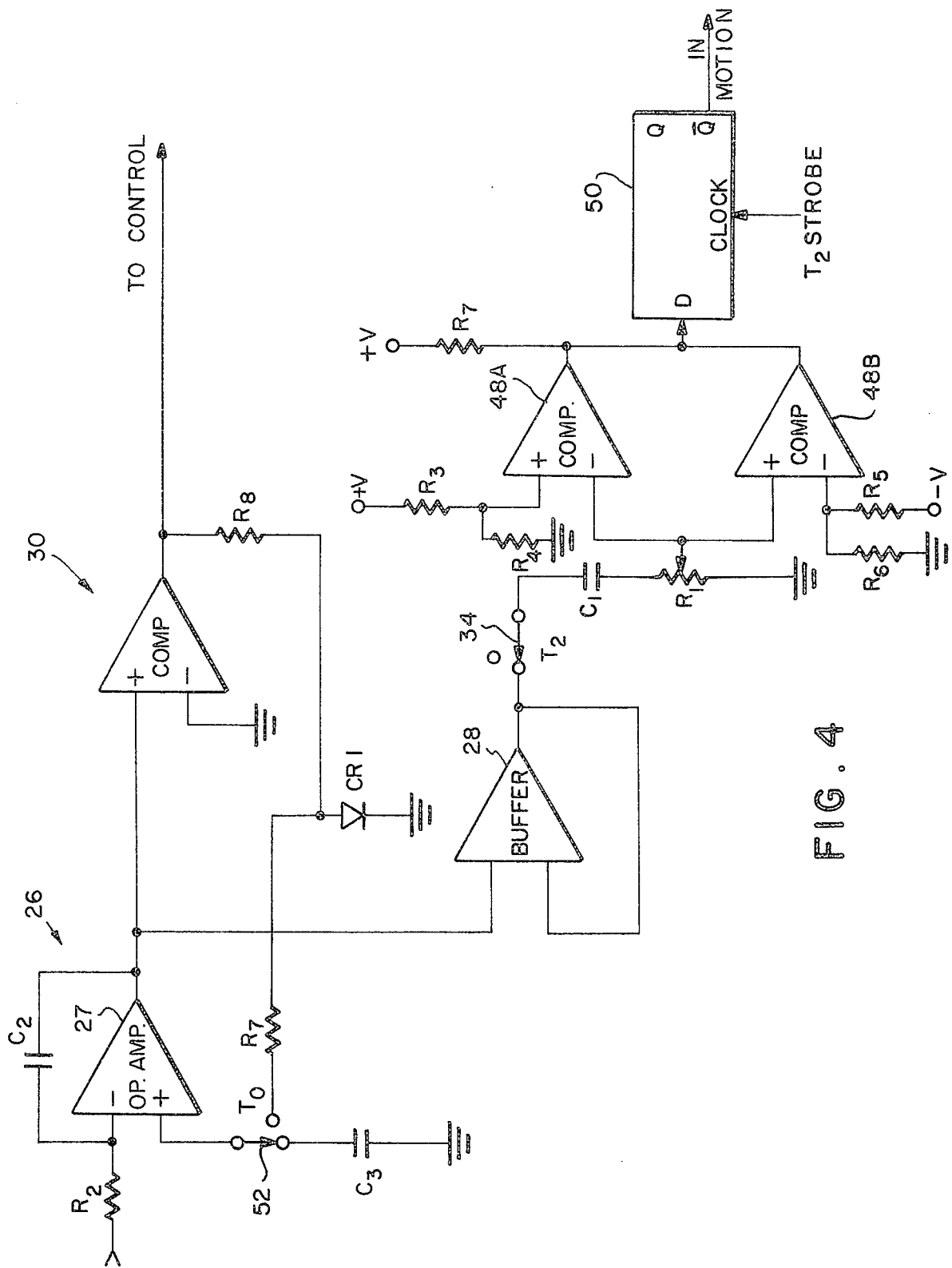
FIG. 4 is a partial block and partial schematic diagram of a preferred embodiment of the invention.

Referring to FIG. 4 there is shown a preferred embodiment of the motion detection circuitry. The integrator 26 comprises an operational amplifier 27 and an associated RC network with a capacitor $C_2$ in the feedback network and a resistor $R_2$ at the inverting input (−) of operational amplifier 27, electrically coupled with buffer amplifier 24 (FIG. 2). The output of the integrator 26 is provided to comparator 30, the reference value of which is typically provided at ground potential. The output of comparator 30 is provided to control circuitry (FIG. 2).

A network for automatically zeroing the dual slope converter may be provided. A suitable autozero network is shown coupling the output of comparator 30 to the non-inverting input of operational amplifier 27. The network comprises a switch 52 coupled alternatively to a capacitor $C_3$ coupled to ground and to a resistor $R_7$ in the feedback loop. Switch 52 couples the feedback loop during the idle period $T_0$. Resistor $R_7$ is coupled both to the anode of a diode $CR_1$, the cathode of which is coupled to ground, and to a resistor $R_8$ coupled to the output of comparator 30. The values of resistors $R_7$, $R_8$ and capacitor $C_3$ are selected for the desired autozero characteristics.

The output of integrator 26 is also coupled to a buffer amplifier 28. The output of buffer amplifier 28 is provided through switch 34 to storage capacitor $C_1$. Switch 34 is closed only during sampling period $T_2$. Capacitor $C_1$ is of suitable storage capacity to supply sufficient current for providing a detectable voltage drop across resistor $R_1$. Resistor $R_1$ has its variable tap coupled to a pair of comparators 48A and 48B which establish a bipolar reference threshold. Comparator 48A provides the positive reference threshold and comparator 48B provides the negative reference threshold, in association with respective resistive divider networks $R_3$, $R_4$, $R_5$ and $R_6$, coupled to stable positive (+V) and negative (−V) voltages supplied by source 39. The tap of resistor $R_1$ is coupled to both the negative input of comparator 48A and the positive input of comparator 48B. The outputs of comparators 48A and 48B are coupled to a common data input of a flip-flop 50. A resistor $R_7$ couples the commonly converted outputs of comparators 48A and 48B to a suitable positive voltage reference (+V) to ensure reliable switching of flip-flop 50. The flip-flop 50 is operative to store the output indication of motion and is strobed during the sampling period $T_2$ in order to accept and store information indicative of motion. The logic state stored by flip-flop 50 may be provided to suitable utilization apparatus as hereinabove described.

It will be appreciated that the interconversion interval should be selected to correspond to the expected rate of change of the analog input value in order that the output of the motion sensing circuit will be meaningful. Selection of the interconversion interval, according to known calibration characteristics, provides a convenient means for determining the rate of change of the analog input without affecting the digitized output.

The invention provides a simple means for indicating motion in a remote sensing digital weighing system. Other embodiments of the invention will occur to those of ordinary skill in the art, and it is not intended that the present invention be limited except as indicated by the appended claims.

What is claimed is:

1. For use in an electronic digitizer, circuitry for detecting the rate of change of an analog input signal and providing a digital logic signal representation thereof, comprising:
   a dual-slope analog-to-digital converter operative in successive conversion cycles and having an integrator which integrates the analog input signal during a fixed-length sampling interval and which integrates a reference signal during a variable-length second interval, the ratio of the two intervals being digitally determined to provide a digital representation of the magnitude of the analog input signal;
   means for storing an analog representation of the output signal from the integrator of the dual-slope converter between the sampling and second intervals of a first conversion cycle;
   means operative in response to the stored analog representation and to the integrator output between the sampling and second intervals of a second conversion cycle succeeding said first conversion cycle for producing a signal representative of the difference therebetween;
   means for providing a predetermined reference threshold; and
   means for comparing said reference threshold with said difference signal to provide a digital output signal indicative of whether the rate of change of the analog input signal falls within preselected limits as determined by the reference threshold.

2. Circuitry according to claim 1 wherein said analog representation is transferred to said storing means for storage and comparison with subsequent input signal representations.

3. Circuitry according to claim 2 wherein said reference threshold providing means comprises means for providing a bipolar reference threshold; and said storing means includes a capacitor coupled in series with the output of said integrator.

4. The circuitry of claim 1 wherein the means for storing comprises a resistor and a capacitor in series connection with the output of the dual-slope converter integrator.

5. The circuitry of claim 4 wherein the series-connected capacitor and resistor are periodically connected to the integrator output between the sampling and second intervals of each conversion cycle, a change in the output signal from the integrator causing a current to flow through the resistor to vary the charge stored by the capacitor, the current flowing through the resistor providing a signal representative of the rate of change of the analog input signal.

6. A method for providing analog-to-digital conversion of an analog input signal having periodic variations and for indicating when the variations are below a predetermined magnitude, comprising the steps of:

performing a plurality of dual-slope analog-to-digital conversion cycles, including the steps of:

applying the input signal to an integrator of an analog-to-digital converter during a fixed first period of time;

applying a reference voltage to the integrator during a variable-length, second period of time; and digitally determining the ratio of the second period to the first period to provide a digital representation of the magnitude of the analog input signal;

storing an analog representation of the output signal from the integrator of the dual-slope converter between the first and second period of each dual-slope conversion cycle;

comparing the stored analog representation from the previous dual-slope conversion cycle with the integrator output between the first and second periods of the present conversion cycle to provide a signal representative of the difference therebetween; and determining when the signal representative of the difference exceeds a predetermined threshold and providing a digital output signal indicative thereof.

* * * * *

UNITED STATES PATENT AND TRADEMARK OFFICE
CERTIFICATE OF CORRECTION

PATENT NO. : 4,008,405
DATED : February 15, 1977
INVENTOR(S) : Leopold Neumann and Bernard M. Gordon It is certified that error appears in the above-identified patent and that said Letters Patent are hereby corrected as shown below:

Column 2, line 20, after "digital" insert --signal--.

Signed and Sealed this nineteenth Day of July 1977

[SEAL]

Attest:

RUTH C. MASON
Attesting Officer

C. MARSHALL DANN
Commissioner of Patents and Trademarks